United States Patent [19]
Carter

[11] Patent Number: 5,819,208
[45] Date of Patent: Oct. 6, 1998

[54] QUANTIFYING CIRCUIT PERFORMANCE

[75] Inventor: Malcolm Edward Carter, Harlow, United Kingdom

[73] Assignee: Northern Telecom Limited, Montreal, Canada

[21] Appl. No.: 739,359

[22] Filed: Oct. 29, 1996

[51] Int. Cl.⁶ .................................................. G06F 11/00
[52] U.S. Cl. ...................... 702/182; 702/123; 702/119; 371/25.1; 395/185.01; 395/183.05
[58] Field of Search .............................. 364/551.01, 580, 364/579, 571.03, 550, 420; 371/128, 26, 25.1; 395/183.01, 184.01, 183.05

[56] References Cited

U.S. PATENT DOCUMENTS

| | | | |
|---|---|---|---|
| 5,581,491 | 12/1996 | Biwer et al. | 364/580 |
| 5,583,875 | 12/1996 | Weiss | 371/28 |
| 5,600,576 | 2/1997 | Broadwater et al. | 364/571.03 |

*Primary Examiner*—Kamini Shah
*Attorney, Agent, or Firm*—John D. Crane

[57] ABSTRACT

The invention relates to automated testing of equipment items of the electronic, electrical, and optical type over a range of environmental conditions. A testing apparatus operates to vary an operating environment of an item of test equipment between a lower extreme and an upper extreme, and iteratively searches each test parameter for a peak response. The peak response is compared with a response limit specified in a customer specification or an international standard. The apparatus assesses a design robustness of the equipment item by comparing a set of measured responses with a maximum range of responses specified in the customer specification or international standard. The apparatus produces a data output for each performance parameter tested, identifying performance parameters which are outside the customer specification, or which have insufficient design robustness.

9 Claims, 17 Drawing Sheets

QUANTIFYING CIRCUIT PERFORMANCE

TECHNICAL FIELD

The present invention relates to the field of reliability and performance testing of equipment items of the electrical, electronic and optical type, and particularly although not exclusively in relation to the performance and reliability testing of telecommunications equipment.

INTRODUCTION

A specification for an item of telecommunications equipment typically specifies (i) a set of functional performance specifications relating to performance parameters which the equipment has to meet, and (ii) a set of operating environmental conditions under which the specified performance criteria must be achieved.

The functional performance criteria are specific to the particular item of equipment tested, and may include performance parameters of voltage output, current output, supply voltage, adherence to protocols, traffic concentration, data rate, noise limits, power consumption or the like.

Environmental operating conditions include temperature, humidity, vibration and electromagnetic environment.

In general, a specification for an item of equipment will include a specification of performance limits set out in an international standard, for example an International Telecommunications Union (ITU) standard, formerly called a CCITT (Committee Consultative International Telegraphic Telephonique) standard within which the equipment must operate, and a set of customer requirements. The international standard requires performance of specified parameters, for example pulse width, pulse amplitude, protocol etc. to meet defined limits as the equipment is tested within a range of operational environmental conditions, for example temperature or humidity.

Additionally, a customer may specify a range of performance parameters extending beyond those set out in the international standard, and/or may specify performance of the equipment within international standard performance limits, but for environmental conditions extending outside those specified in the international standard. For example for an item of communications equipment, a Canadian equipment user may specify that the equipment is to operate down to −40 degrees centigrade so as to operate in local climate conditions in Canada, whilst an equivalent United Kingdom equipment operator may specify performance of a similar equipment item down to −5 degrees centigrade in accordance with UK climatic conditions. In another example, a user of under sea communications equipment may specify that performance be maintained under a customer specified pressure.

An example of an equipment to be tested may comprise a regenerative circuit, which operates in a footway box under a pavement. Such an equipment may be cased, having cables entering the casing and cables exiting the casing, the regenerative equipment operating to receive incoming signals, boost signal amplitude, and output amplified signals. Another example may be an item of routing equipment for routing exchange calls, or an interface equipment for interfacing a telephone set to an exchange. Another example of an item of equipment requiring testing could be a telephone handset itself.

In general, for each new piece of equipment for each new market for which a different international standard or a different customer specification applies, the performance of the parameters specified in the international standard relating to that market need to be tested over a range of environmental conditions. Where the customers specify their own environmental parameters, these may be more stringent than those specified in the international standard. Of course, where a first customer has a more stringent set of environmental conditions than a second customer, the equipment does not normally need to be retested for the second customer. However, in general for an item of equipment to be sold in different territories to different customers, an extensive program of testing of performance parameters over a range of environmental conditions needs to be undertaken in each case. Testing of equipment prior to shipment is an expensive and time consuming procedure.

SUMMARY OF THE INVENTION

According to one aspect of the present invention there is provided a method of assessing a robustness of an item of equipment, said method comprising the steps of:

setting a range of operating environments for the equipment;

setting a performance limit data describing a limit of performance for the equipment within said range of operating environments;

obtaining data corresponding to actual performances of the equipment within said range of operating environments;

comparing said actual performance data with said performance limit data;

depending on the result of comparing said actual performance data with said performance limit data, implementing a decision either rejecting said equipment as having unsatisfactory robustness, or accepting said equipment as having adequate robustness.

In one specific method, said step of comparing said actual performance data with said performance limit data comprises generating a design robustness index data of said performance limit data divided by said actual performance data. The specific method further comprises steps of resetting said range of operating environments to a range outside a specified range of operating environments, and obtaining data corresponding to actual performance of said equipment at operating environments outside said specified range. Preferably, performance data is obtained within and including said limit of performance. Preferably the method includes the step of generating an environmental robustness index data of a maximum operating environment range of said equipment for which said performance data lies within said performance limit data, divided by a specified operating environment range of said equipment.

According to a second aspect of the present invention, there is provided a method of assessing a robustness of an item of equipment, said method comprising the steps of:

defining a limit of performance of said equipment item;

defining an environmental operating range of said equipment item;

obtaining a performance data of said equipment at extremes of said environmental operating range;

obtaining performance data of said equipment at an ambient operating environment between said extremes of said environmental operating range;

comparing a difference between said performance data at said ambient operating environment and said limit of performance with a difference between a said performance data at an extreme of said operating range and said performance data at said ambient operating environment.

In one embodiment of the invention, an apparatus for assessing a robustness of an item of equipment, comprises:

means for setting a range of operating environments for the equipment;

means for setting a performance limit data describing a limit of performance for the equipment within said range of operating environments;

means for obtaining data corresponding to actual performances of the equipment within said range of operating environments;

means for comparing said actual performance data with said performance limit data, and depending on the result of said comparison, producing data describing said equipment as having unsatisfactory robustness, or producing data describing said equipment as having adequate robustness.

Another embodiment according to the present invention an apparatus for assessing a robustness of an item of equipment comprises:

means for inputting a limit of performance of said equipment item;

means for inputting an environmental operating range of said equipment item;

means for obtaining a performance data of said equipment at extremes of said environmental operating range;

means for obtaining performance data of said equipment at an ambient operating environment between said extremes of said environmental operating range;

means for comparing a difference between said performance data at said ambient operating environment and said limit of performance with a difference between a said performance data at an extreme of said operating range and said performance data at said ambient operating environment.

According to a third aspect of the present invention there is provided a method of assessing a robustness of an item of equipment, said method comprising the steps of:

setting a data concerning a range of specified operating environments for the equipment;

setting a performance limit data describing a limit of performance for the equipment;

obtaining data corresponding to actual performances of the equipment outside said range of specified operating environments;

comparing data concerning said actual operating environment with data concerning said specified operating environment;

depending on the result of comparing said actual operating environment data with said specified operating environment data, either implementing a decision for either rejecting said equipment as having unsatisfactory robustness, or accepting said equipment as having adequate robustness.

In the third method, said step of comparing data concerning said actual operating environment with data concerning said specified operating environment preferably comprises dividing data describing said actual range of operating environment by data describing said specified range of operating environment.

In a fourth aspect of the present invention, there is provided a method of configuring a factory test chamber apparatus for environmental testing of an item of production equipment comprising;

considering a result data resulting from testing a said item of equipment within a specified set of environmental conditions for each of a plurality of specified performance parameters, said result data comprising a robustness index data of said equipment in respect of each said performance parameter;

for each said robustness index data below a predetermined value, configuring a said factory chamber apparatus to implement a test of a corresponding said parameter at environmental conditions beyond said specified environmental conditions.

In the fourth aspect, said step of configuring a said factory chamber apparatus preferably comprises:

inputting data describing a plurality of specified performance parameter limits;

configuring said apparatus to implement a test in which said environmental conditions are exceeded up to a point at which said equipment outputs a signal corresponding to a said specified performance limit.

The invention includes a factory test chamber configured in accordance with the fourth aspect.

In another embodiment of the present invention, an apparatus for performance testing an item of equipment comprises:

means for controlling an environment;

test means for testing a set of performance parameters of said equipment item;

means for recording results of a set of said performance parameter tests implemented by said testing means; and means for analysing said results of performance parameter tests;

wherein said test means operates to automatically implement a test routine to test said performance parameters at a lower environment condition, an upper environment condition and an environment condition between said upper and lower environment conditions;

said analysing means automatically analyses said test results to identify performance parameters which lay outside predefined specified performance limits; and and said analysing means automatically analyses said test results to identify performance parameters which lay within said specified performance limits, and calculates an index of robustness on said performance parameters lying within said specified limits.

BRIEF DESCRIPTION OF THE DRAWINGS

For a better understanding of the invention, and to show how the same may best be carried into effect, reference will now be made to the accompanying diagrammatic drawings, which illustrate by way of example only, preferred embodiments and methods according to the invention, and in which.

DETAILED DESCRIPTION OF THE PREFERRED EMBODIMENTS AND METHODS

Figure 1:
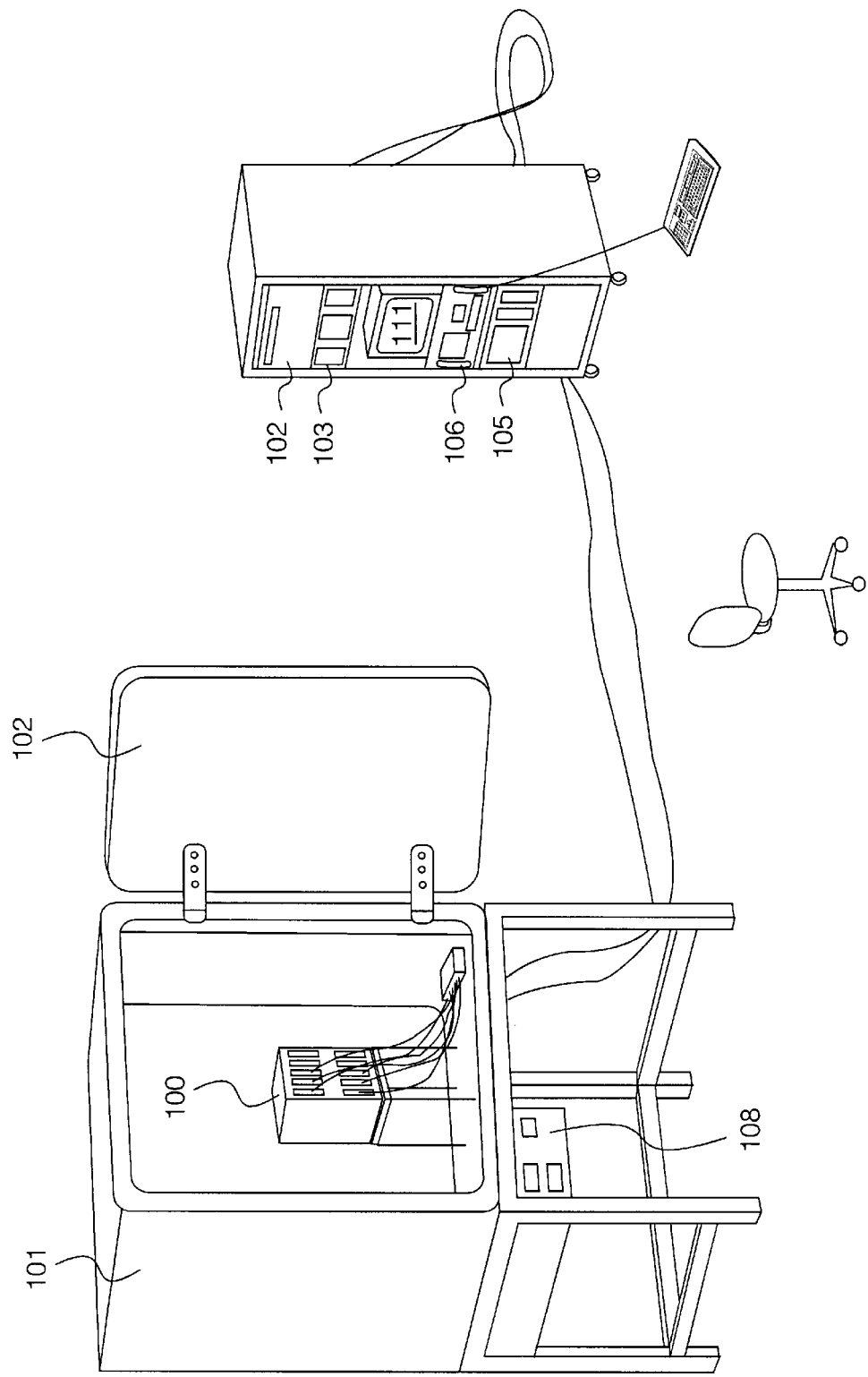
FIG. 1 illustrates a performance testing apparatus for testing performance of an item of equipment under a variety of controllable environment conditions.

Items of high value, high complexity equipment, for example as found in the telecommunications industry, may require testing for a large number of performance parameters, and undergo a large number of performance tests under predetermined environmental conditions, before being supplied to customers. The penalties for return of warranted equipment items which do not meet customer specified environmental conditions can be a high cost to the manufacturer of the equipment. For high value, high complexity equipment items, it is often only practicable to test a single pre-production equipment item prior to commencing full production for a run of thousands of production equipment items.

In pre-production testing, a complex item of equipment may undergo a series of one hundred or more individual performance tests over a period of days or weeks, during which signal responses of the equipment resulting from the performance tests carried out within environmental conditions specified by a customer are recorded. Typically, these environmental conditions may specify an upper and/or lower temperature limit, an upper and/or lower humidity limit, upper and/or lower pressure limits, or other environmental conditions such as electromagnetic noise, shock loadings encountered during transit or any other pertinent physical environmental condition which the equipment item may encounter, and as specified by the customer or in an international standard.

For the complex equipment item, given that each performance parameter test must be made over a range of environmental conditions specified by the customer, there are a large number of individual tests which must take place and a large volume of signal responses from the equipment must be recorded.

The applicants have found, through experience of testing equipment items at environmental conditions beyond those specified by the customer and beyond those for which the equipment is designed, that some equipment may continue to operate satisfactorily, ie within the specified performance limits, at extreme environmental conditions beyond those for which the equipment is designed to operate at. Although the results of testing may show that an item of equipment may perform within specified performance limits over a full set of customer specified environmental conditions, in other words although the equipment item may fully meet the customers specification, as a practical matter it is aimed to take advantage of the additional performance margin to build into the equipment design a measure of robustness of the equipment, such that the equipment exceeds the customer specification by a reasonable margin, with the object that the risk of failure of the equipment item when operating within the specified environmental conditions is reduced, and so that if the equipment item is inadvertently subjected to environmental conditions falling just outside those specified by the customer, the equipment item will not fail.

A problem with testing the equipment when physically maintained at environmental conditions outside those specified by the customer, and/or to which the equipment has been designed to operate are as follows:

Firstly, operating the equipment outside specified environmental conditions risks failure of the item of equipment, or may strain the components so as to lead to a reduction of reliability of the equipment, so that it is risky to supply the equipment to a customer.

Secondly, exceeding the environmental condition in order to carry out a particular test may invalidate the results of other previous or subsequent tests carried out within the specified environmental conditions. In other words, subjecting the equipment to environmental conditions outside those specified may produce damage to the equipment item or change in the characteristics of the equipment item which mean that the other performance tests carried out within environmental conditions are not the same as those which would have been obtained if the equipment had not been subjected to environmental conditions outside the specification. This may lead to an inaccurate assessment of the robustness of the equipment.

If pre-production testing shows that equipment meets a specification but that there are some performance parameters close to limit, as a temporary measure to get the production equipment to market without recourse to redesign, a phase of post-production testing may be carried out, known as environmental stress screening, in which production equipment is taken beyond environmental limits to test for performance and failure, pending a later redesign of the equipment to remove the need for post-production testing.

Therefore, a method of testing an equipment item within the specified operating environment conditions, which firstly detects whether the equipment complies with performance parameters specified within the customer specification or international standard specification over the range of operating environments of those specifications, and secondly which allows a margin of robustness to be built into the equipment to allow for increased reliability at, near or beyond the operating environment specified in the customer specification or international standard may enable selected production equipment of tested performance and robustness to be shipped to customers.

Further, a method of performance testing equipment which identifies performance parameters which come closest to the specified performance limits whilst the equipment is maintained within the specified operating environmental conditions may reduce the need to test the equipment outside the specified operating environmental conditions. This may avoid unnecessarily subjecting the equipment to environmental stress, whilst still gaining a measure of the equipment's robustness.

Additionally, an apparatus for automatically implementing such equipment tests, and a method of operating the apparatus to implement the tests are desirable in order to reduce the time and cost penalties incurred by the pre-production test phase in the overall equipment manufacturing process.

Additionally, by identifying test parameters which are at or near predefined limits of performance and robustness, a post production factory screening process may be optimised to test only performance parameters which are critical, or may be avoided altogether.

Figure 2:
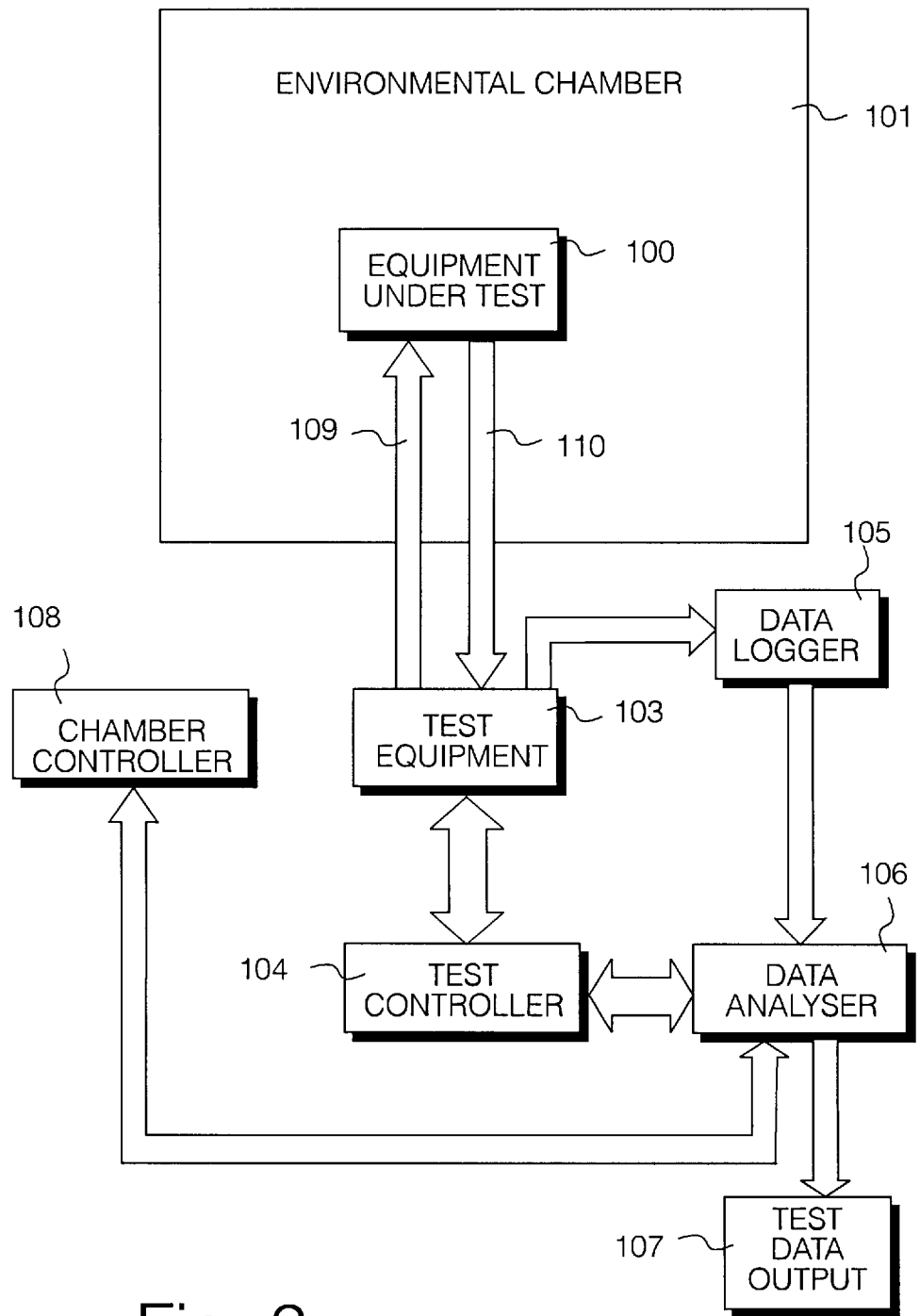
FIG. 2 illustrates a general layout of the performance testing apparatus, of FIG. 1.

Referring to FIGS. 1 and 2 herein, there is shown a performance testing apparatus for testing an item of equipment 100 of the electronic, electrical or optical type, for example a telecommunications switch apparatus. The performance testing apparatus comprises an environmental chamber comprising an enclosed casing 101 into which items of equipment under test may be placed, the chamber having a securable door 102, the chamber being adaptable for producing a variety of environmental conditions within the chamber, for example variations of temperature, variations of humidity, variations of pressure, or capable of containing a means for altering the environment with the chamber, eg an electromagnetic noise generator for creating an electromagnetic noise environment; a selection of test equipment items 103, the test equipment items comprising instruments selected for testing the particular performance parameters of the equipment under test which are of interest; a test controller 104 which is capable of being pre-programmed to step through a series of test sequences, and for controlling the test equipment to implement the tests; one or more data loggers 105 for recording performance parameter signals in response to test signals monitored by the test equipment 103; an analysing means 106 for analysing the performance parameter responses collected by the data logger 105 and for producing a data output 107 corresponding to individual performance parameter responses and data concerning an analysis of performance parameter responses; and a chamber controller 108 for implementing changes in the environment within the chamber. The data analyser 106 is capable of generating an environment control signal, in response to an analysis of recorded data responses, for controlling in real time the chamber controller 108 which controls the environment within the chamber. The chamber controller may control environmental conditions such as temperature, humidity, pressure or any other environmental condition being varied. Alternatively, where specific items of environmental generating equipment are placed within the chamber, eg an electro-magnetic noise source, the data analyser 106 may generate signals to control the environmental generating apparatus controlling the electromagnetic noise.

Figure 3:
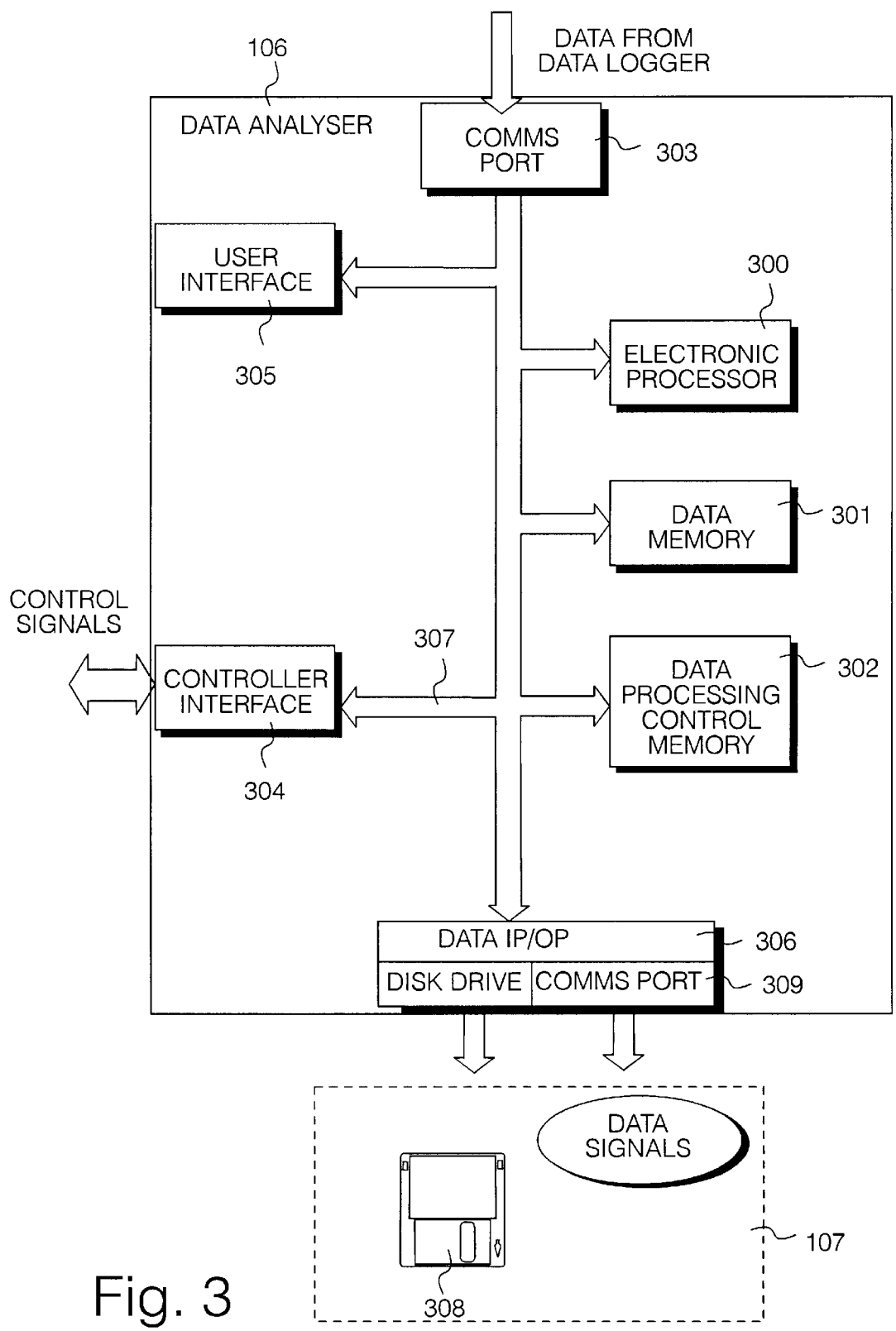
FIG. 3 illustrates an architecture of a data analyser of the performance testing apparatus of FIGS. 1 and 2 implemented by the apparatus of FIGS. 1 to 3.

Referring to FIG. 3 herein, there is shown in further detail the data analyser 106. Data analyser 106 comprises an electronic processor 300 for controlling operation of the analyser; a data memory 301 for storing data input from the data logger 105; a data processing control memory 302 for storing a set of control signals for controlling operation of the electronic processor 300, for implementing processing of data in the data memory 301 and data input from the data logger 105 and also for storing specification data relating to specified performance parameter limits; a communications input port 303 for receiving data signals from the data logger 105; a controller interface 304 for interfacing with the test controller 104, enabling the is electronic processor 300 to send control signals to the test controller for controlling the chamber controller 108 and the test equipment 103 in accordance with a data analysis carried out under control of the signals stored in the data processing control memory 302; a user interface 305, comprising a monitor 111 and a keypad device 112, a data input/output port 306 for outputting data corresponding to respond signals, test signals and results of analysis of the data collected by the data logger 105; and an internal bus 307 for communicating between the processor, data memory 301, data processing control memory 302, controller interface 304, user interface 305, and data input/output port 306.

Data output from the data input/output port 306 may comprise data signals stored on a recording medium, for example a floppy disk 308, or data signals output over a communications link connected to a communications port 309 of the data output port. The specification data may be input to the analyser via the user interface 305, or the data input/output port 306.

Figure 4:
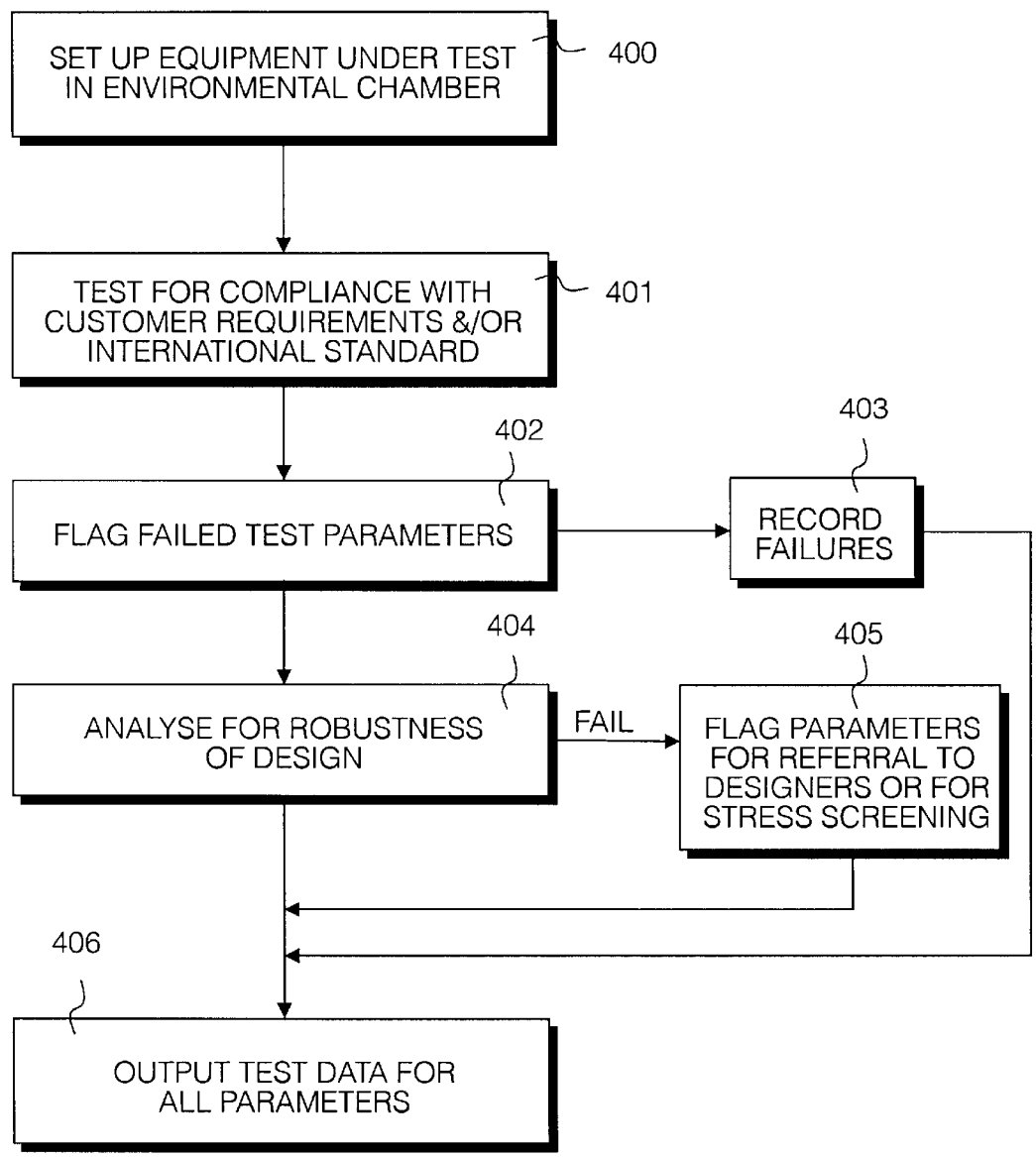
FIG. 4 illustrates an overview of a test process for an item of equipment.

Referring to FIG. 4 herein there is shown an overview of a test process implemented using the performance testing apparatus described in FIGS. 1 to 3 herein above. Under testing the equipment to be tested is subjected to internal and external forcing factors, as follows:

i. Internal forcing factors comprising test signals 109 generated by the test equipment and applied to the equipment under test 100 in order to evaluate response signals generated by the equipment under test. For example, an internal forcing factor may include an input voltage to a terminal of the equipment, an input current, an input data signal, an input light pulse signal or like input signals.

ii. External forcing factors comprising variations of external environmental conditions eg temperature, humidity, pressure, vibration, electromagnetic noise, radiation or the like.

The customer specifications and international standards represent envelopes of internal and external forcing functions within which the equipment must meet specified performance parameters. The extremities of the internal and external forcing functions are the specified extremities of input current, voltage, temperature, pressure etc which the equipment is expected to encounter.

Firstly, at step 400 the equipment under test is placed in the environmental chamber and connected to the test equipment 103. The connections to the test equipment are appropriate to the type of equipment under test. For example, connections may be made by coaxial cable, optical fibre, twisted wire pair or the like. The test equipment 103 is selected to test specific performance parameters set out in the customer specification and/or international standard which the equipment is designed to meet. The test equipment 103 may be pre-programmed or operated by the test controller 104 to undertake a series of tests, sending out test signals 109 to the equipment under test. The equipment under test 100 produces response signals 110, which are monitored by the test equipment 103. A full test program, testing for each individual parameter may be controlled by the test controller 104, which sends signals to the test equipment 103 for instructing the sending out of test signals, and instructions to the chamber controller 108 for varying the environment within the chamber in real time.

In step 401 the equipment is tested for compliance with customer performance specifications and/or international standard specifications, within the environmental conditions identified in those specifications. This is done by recording data corresponding to the test signals and response signals using the data logger, and analysing the logged data using the data analyser 106.

In step 402, if the equipment fails a test for compliance for any particular parameter, a failure is recorded for that parameter in step 403.

In step 404, data corresponding to the response signals of the equipment under test are analysed for robustness of design for each performance parameter specified in the test. If the analysis in step 404 shows that the equipment fails a predetermined limit for robustness, which can be set by entering the robustness data corresponding to the robustness limit into the data analyser 106, then the particular performance parameter for which the robustness criteria is not met is stored in step 405, and identified as a performance parameter having a non-satisfactory robustness.

In step 406, data corresponding to the results of the tests for compliance, including any recorded failures, and data corresponding to the results of the analysis for robustness, including any performance parameters identified as having insufficient robustness are output on a data carrier, eg the floppy disk 308, stored in the data memory 301 of the data analyser, or transmitted as data signals to another item of apparatus, for example a workstation or personal computer.

Figure 5:
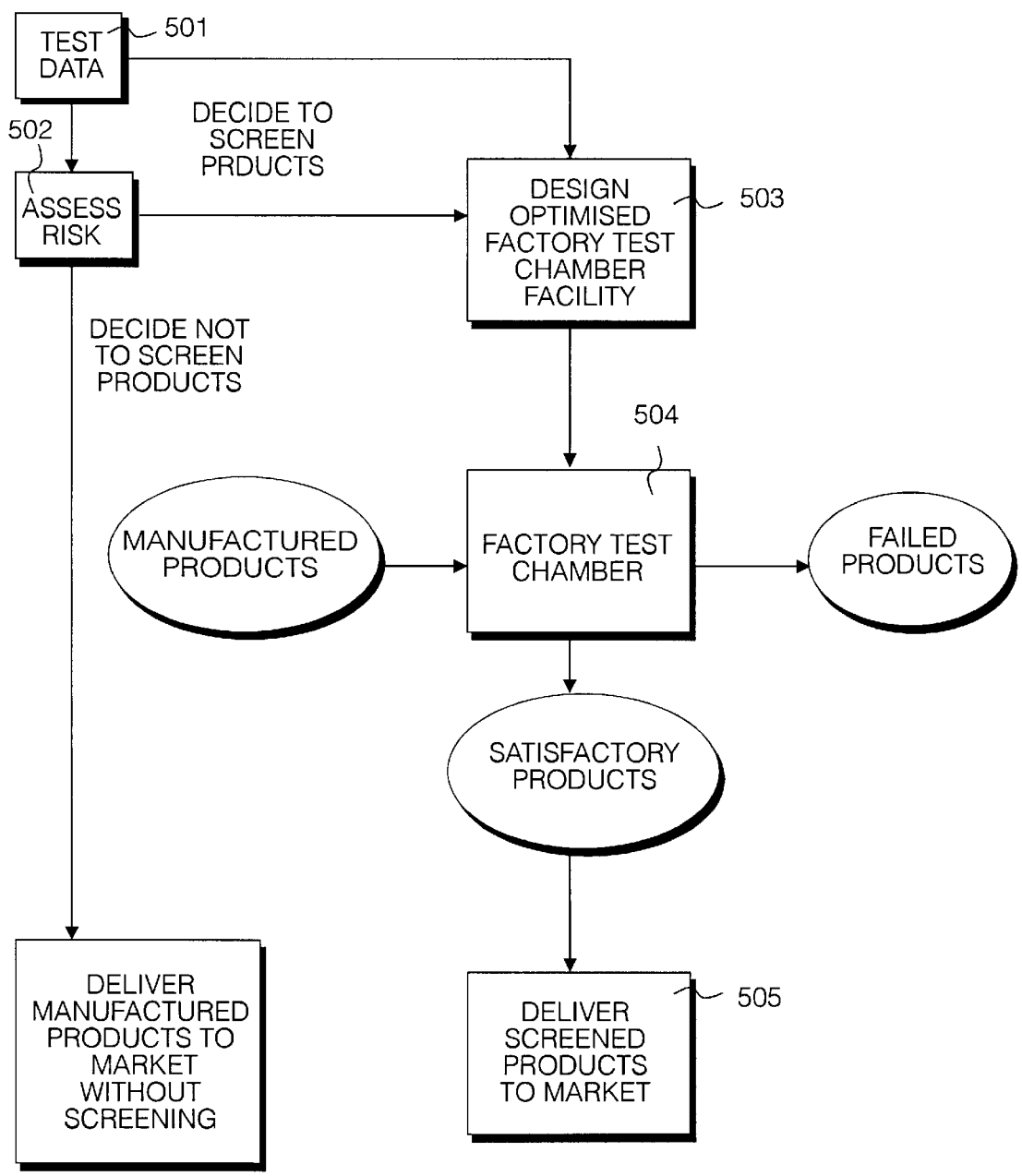
FIG. 5 illustrates an assessment and screening process for items of equipment.

Referring to FIG. 5 herein, there is shown an equipment assessment and screening procedure, utilizing the test data obtained by the process of FIG. 4 in order to design and construct an optimized factory testing facility for the purpose of environmental stress screening of manufactured equipment items, prior to shipping to customers.

In step 501, the test data obtained as a result of the process described in FIG. 4 herein is analysed, and a commercial risk in releasing a production run of the equipment is assessed at step 502. Step 502 is a decision based on technical test results. If it is decided that the equipment can be safely sent to market without environmentally screening each equipment at the end of the manufacturing process, then the equipment is sent directly to a customer in step 503.

However, if it is decided that environmental screening of each equipment is required, prior to sending to market, then the test data obtained as a result of performance testing as described with reference to FIG. 4 herein above, is used to design an optimized factory test chamber facility 504 for testing individual equipment by environmental stress screening prior to delivering satisfactorily screened equipment to market in step 505.

By obtaining detailed test data from the performance testing phase described herein above, a dedicated test chamber facility can be set up, testing only those performance parameters which have been identified as having unsatisfactory robustness in the analysis step of FIG. 4.

Where test parameter failures are recorded in step 403, the output test data collected in step 406 is made available to design engineers of the equipment, who may use the data to redesign particular systems or sub-systems of the equipment in order to improve the performance of the equipment with respect to the failed test parameter, so that the redesigned equipment may then pass the performance compliance test in step 401 under retesting.

Figure 6:
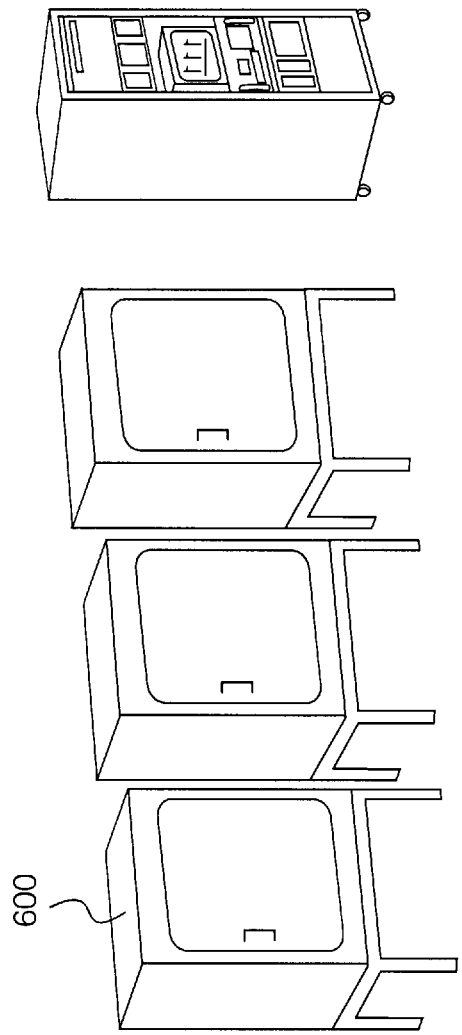
FIG. 6 illustrates a factory test chamber apparatus for testing production equipment items.

FIG. 6 herein shows an example of a factory chamber test facility for stress screening production equipment prior to release to customers. There may be provided one or more environmental chambers 600 for containing production equipment items, a set of test instruments, one or more data loggers, and an analyser configured to implement a minimum number of required test cycles, corresponding to tests of equipment for parameters identified in the pre-production test phase, as having marginally failed robustness.

Referring to FIGS. 2, 3, 4 and 7–11 herein a method of testing an item of equipment in respect of a single performance parameter, and of analysing the results of the performance test will now be described.

Typically, equipment items are tested firstly at ambient conditions, eg room temperature pressure and humidity, and with ambient electromagnetic background, for all performance parameters to check that the performance parameter responses of the equipment fall within those parameters specified in an international standard or by the customer. Then the equipment item is tested at an extreme of the environmental condition specified by a customer, for example at a lowest temperature condition, lowest pressure condition, lowest humidity condition, to check that the performance of the equipment item falls within the performance specified in the international standard or by the customer. The equipment item may then be tested for all performance parameters at another extreme of a customer specified environmental condition, eg a highest specified temperature, pressure or humidity, to check that the performance of the equipment item falls within the performance specified in the international standard or by the customer.

Such testing, whilst testing extreme operating conditions specified for the equipment, may not be completely representative of the actual environments in which the equipment may be expected to operate in practice. For example, the requirement for high temperature in the laboratory may be mutually exclusive with the condition for high humidity, since the high temperature may dry out the test environment. On the other hand, in practice in operation the equipment may be installed in a hot, humid environment, for example in direct sunlight, in a country having a hot, humid climate. To test the equipment for each combination of environmental conditions specified by the customer, for each performance parameter specified in an international standard or customer specification, may lead to a prohibitively large number of individual test operations of the equipment item.

A test cycle for testing whether a single performance parameter selected in step 1100 is within specified limits over a range of specified environments will now be described. Stages of the test cycle may be undergone for all parameters, either serially or in parallel at each environment, before moving on to the next environment. In step 1101, the environmental chamber 101 is maintained at a first set of environmental conditions, for example ambient conditions comprising room temperature and pressure, normal atmospheric background radiation and normal atmospheric humidity. Test signals are applied to the equipment by the test equipment 103, and the test equipment monitors corresponding response signals of the equipment under test 100. The response signals may comprise signals of voltage, current, cell discard rate, power consumption (measured as a voltage or current), or any other performance parameter specified in the customer specification or international standard. The test equipment, on receiving the response signal converts the response signal into data signal in a format acceptable by the data logger 105, which stores the data signal corresponding to the response signal in, for example a hard drive disk comprising the data logger.

Environmental conditions in the chamber 101 are then changed, for example by the chamber controller 108 in response to a signal from the test controller 104. For example, where the environmental condition being changed is temperature, the chamber controller may heat up the temperature within the environmental chamber to a temperature corresponding to a maximum specified temperature in the customer specification. The test equipment, in response to signals from the test controller, then transmits further test signals, and response signals produced by the equipment under test at the upper specified environment are monitored by the test equipment and recorded by the data logger 105.

The test controller 104 then issues instructions to the chamber controller 108 to change the environmental conditions, eg temperature, to a lower limit specified by the customer. The environmental chamber cools down, and response signals produced by the test equipment at the lower specified temperature in response to the test signals are received by the test equipment and recorded by the data logger 105.

Figure 7:
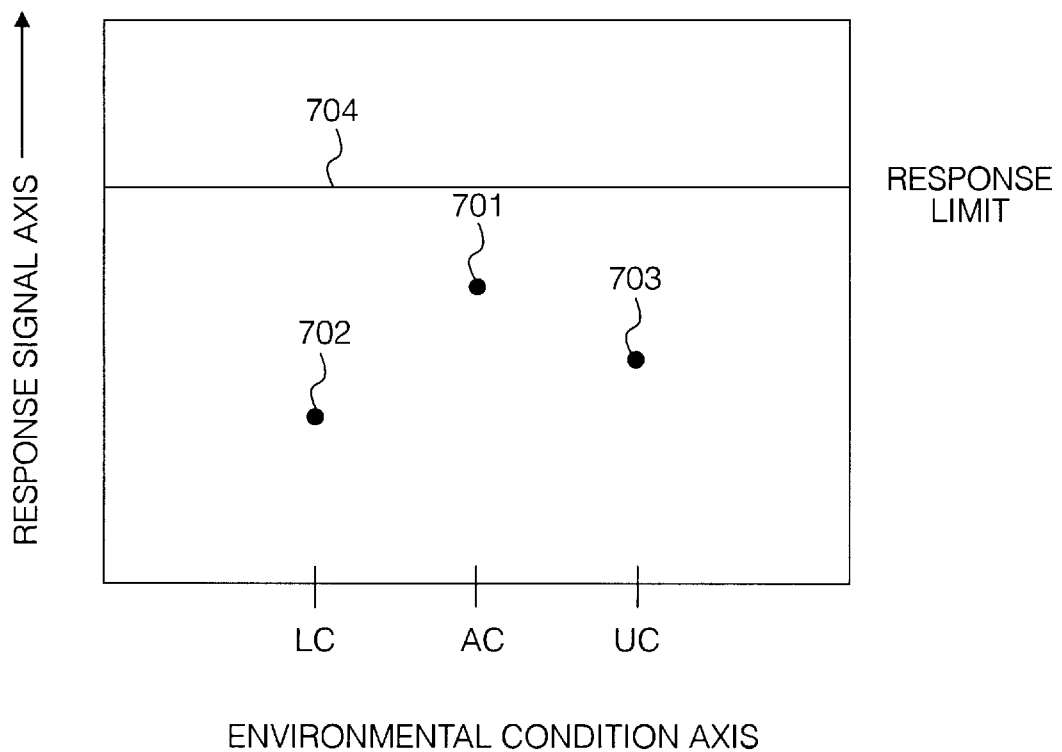
FIG. 7 illustrates a result of a test process carried out on an item of equipment.

Referring to FIG. 7 herein there is shown on the vertical axis a 2-Dimensional plot of the response signals resulting from the tests described above for a single parameter selected in step 1200. As an example, there is shown a plot of a response signal, eg an output voltage at an output terminal of an item of equipment under test, on the vertical axis against the environmental condition, in this case temperature on the horizontal axis. The processor 300 stores data signals representing the signal responses as Cartesian Co-ordinates in 2-Dimensional space. The point 701 in the FIG. 7 illustrates a response signal value for a performance parameter measured by the test equipment with the equipment under test at the ambient environmental condition (AC) eg room temperature 25° C. Similarly, the point 702 represents the value of the response signal produced by the equipment under test at a lower specified limit of the environmental condition (LC), eg a lower temperature limit of −4° C. A third point 703 represents a response signal produced by the equipment under test in response to test signals 109 with the equipment in an environment at an upper environmental condition (UC), for example an upper temperature limit of 90° C.

The data analyser 106 stores in real time during the test, data signals corresponding to the data shown in FIG. 7 in its data memory, and under control of the instructions stored in the control memory 302 implements the following process on the data signals.

The processor 300 retrieves the data signals from the data memory 301, corresponding to the response signals 701, 702, 703. In this case, a single limit of response 704 is specified for the performance parameter in the specification data stored in the control signal memory 302, representing a maximum signal response specified in the customer equipment specification or international standard, in respect of that performance parameter.

In step 1202 the processor 300 compares the data signals corresponding to the response signals with the pre-stored specification data signals corresponding to the response limit. If any of the response signals are beyond the response limit, the processor records data corresponding to a test failure at step 1103, and proceeds to select the next test at step 1115.

Figure 8:
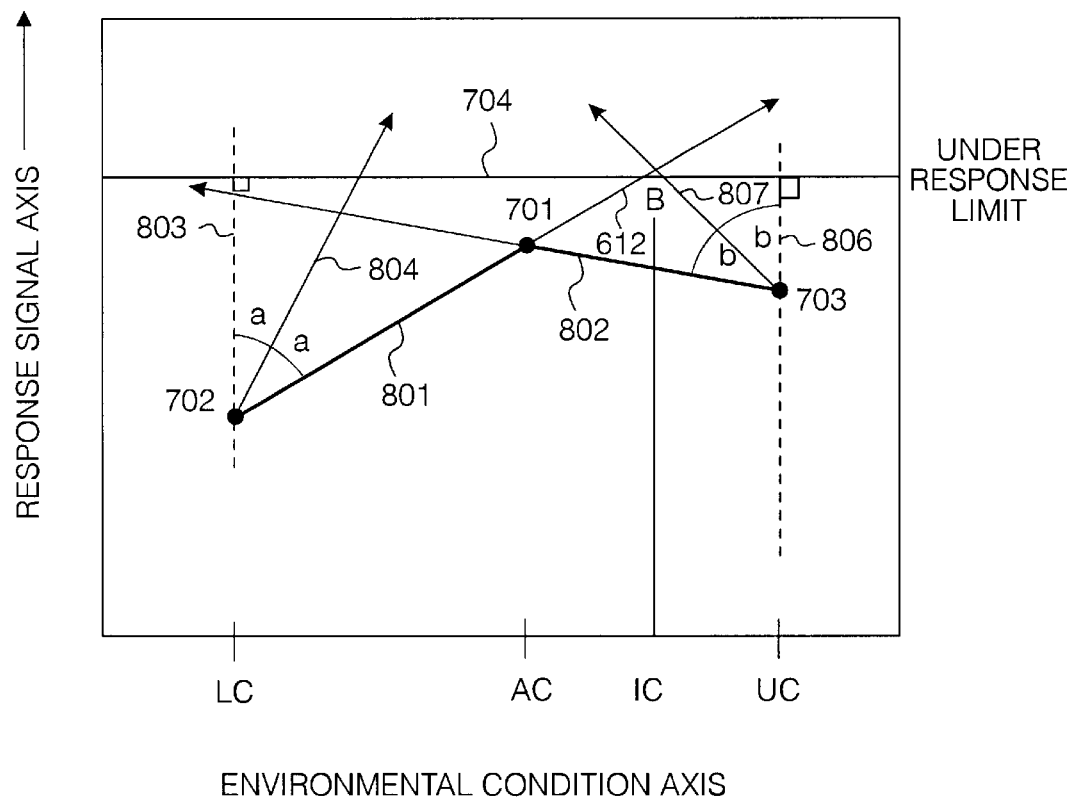
FIG. 8 illustrates a result of an automated analysis of the test result of FIG. 7.

If the response signals are within the limit, referring to FIG. 8 herein, the processor implements a search to determine whether a peak signal response of the equipment is within the specified allowable limit of signal response. The search is implemented as follows. At step 1104 the processor 300 calculates estimated signal responses represented as Cartesian Co-ordinates in 2-D space. The processor 300 calculates straight lines 801, 802 between the first response point 701 and the second response point 702, and between the first response point 701 and the third response point 703. The processor then calculates a shortest line 803 between the second response point 702 and the upper response limit 704. The processor 300 calculates an angle between the line 803 connecting the second response point 702 and the upper response limit 704, and the line 801 connecting the first response point 701 with the second response point 702. The processor 300 calculates a line 804 bisecting the angle 2a between the lines 801 and 803.

The processor also calculates an extrapolation of the line 802 between the first point 701 at ambient environmental conditions and the third point 703 corresponding with the upper environmental condition UC, and extrapolates this line linearly in the direction of the lower environmental condition LC resulting in the extrapolated line 802. The processor 300 then calculates a point A corresponding to the intersection between the line 804 bisecting the angle 2a and the extrapolated line 805. In the example shown in FIG. 8, the point A represents an estimated maximum signal response at a level beyond the first or second signal responses but within the upper response limit 704, and between the ambient environment condition and the lower specified environment condition.

Similarly, the processor 300 calculates a second estimated maximum signal response point B, lying between the first response point 701 and the third response point 703, ie between the ambient environment condition and the upper specified environment condition. The second estimated response point B is calculated by calculating a locus of a line 806 connecting the third response point 703 with the upper response limit 704 by the shortest route, and by calculating a line 807 bisecting the angle 2b between the line connecting the first and third response points 701, 703 and the line 806 connecting the third response point and the upper response limit 704.

The processor calculates by linear extrapolation of the line 801 connecting the second response point 702 representing the signal response at the lower environmental condition, and the first response point 701 representing the response signal at the ambient environmental condition, extrapolating the line 801 towards the upper environmental condition limit UC. The estimated maximum response point B between the first response point 701 and the third response point 703 is estimated as the intersection between the extrapolated line 801 and the line 807 bisecting the angle 2b.

The processor determines whether the data signals corresponding to the estimated maximum signal responses A or B are within the predetermined response limit 704, at step 1205.

If either estimated response point lies beyond the response limit 704, as is the case in FIG. 8, then in step 1106 the data analyser 106 calculates the amount of a corresponding intermediate environmental condition IC at which the estimated beyond limit response point is expected to occur, in order to examine the external signal response at that environment, in step 1106.

The data analyser sends a signal to the test controller 110 which instructs, by way of instruction signals, the chamber controller 108 to alter the environmental conditions in the environmental chamber 101 to those corresponding to the intermediate environmental condition IC identified by the data analyser 106. For example, where the environmental condition being varied comprises temperature, the environmental condition IC represents a temperature between the ambient temperature at ambient condition AC and the upper limit temperature at upper environmental condition limit UC.

With the equipment maintained at the intermediate environmental condition IC, the test equipment transmits test signals to the equipment under test, and monitors response signals produced by the equipment under test at the intermediate environmental condition IC. The data logger records the resultant response signals and downloads these to the data analyser 106. The data analyser 106 stores the actual response signal data point corresponding to the actual measured performance parameter of the equipment under test at the intermediate environmental condition, as indicated schematically by the point 901 in FIG. 9 herein. If the intermediate response point 901 lies beyond the upper response limit, then the processor stores a record failure data in step 1108, and goes on to select the next test in step 1115.

Figure 9:
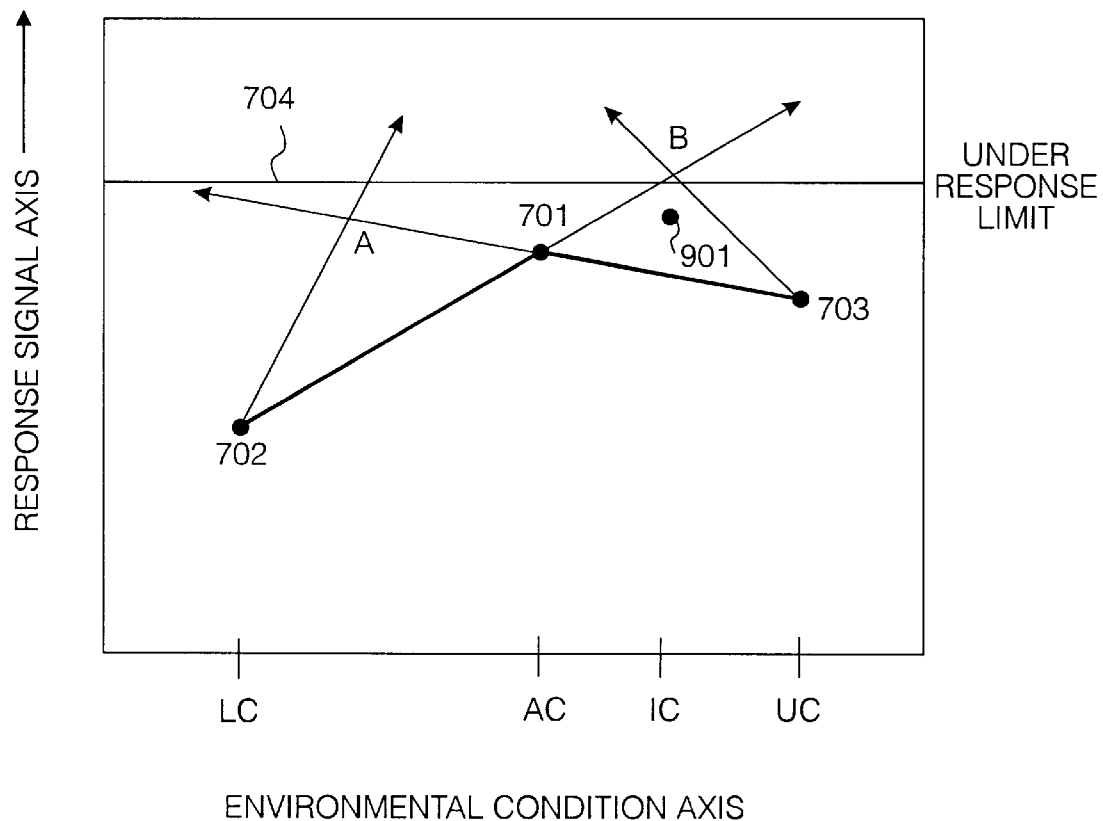
FIG. 9 illustrates a further test result of the equipment item.

If the intermediate response point 901 lies within the upper response limit 704, then using the signal responses either side of the intermediate signal response 901, ie the ambient condition signal response 701 and the upper environmental condition signal response 703, the processor calculates new estimate maximum signal responses similarly as described herein with reference to FIGS. 7 to 9, at step 1109.

Figure 10:
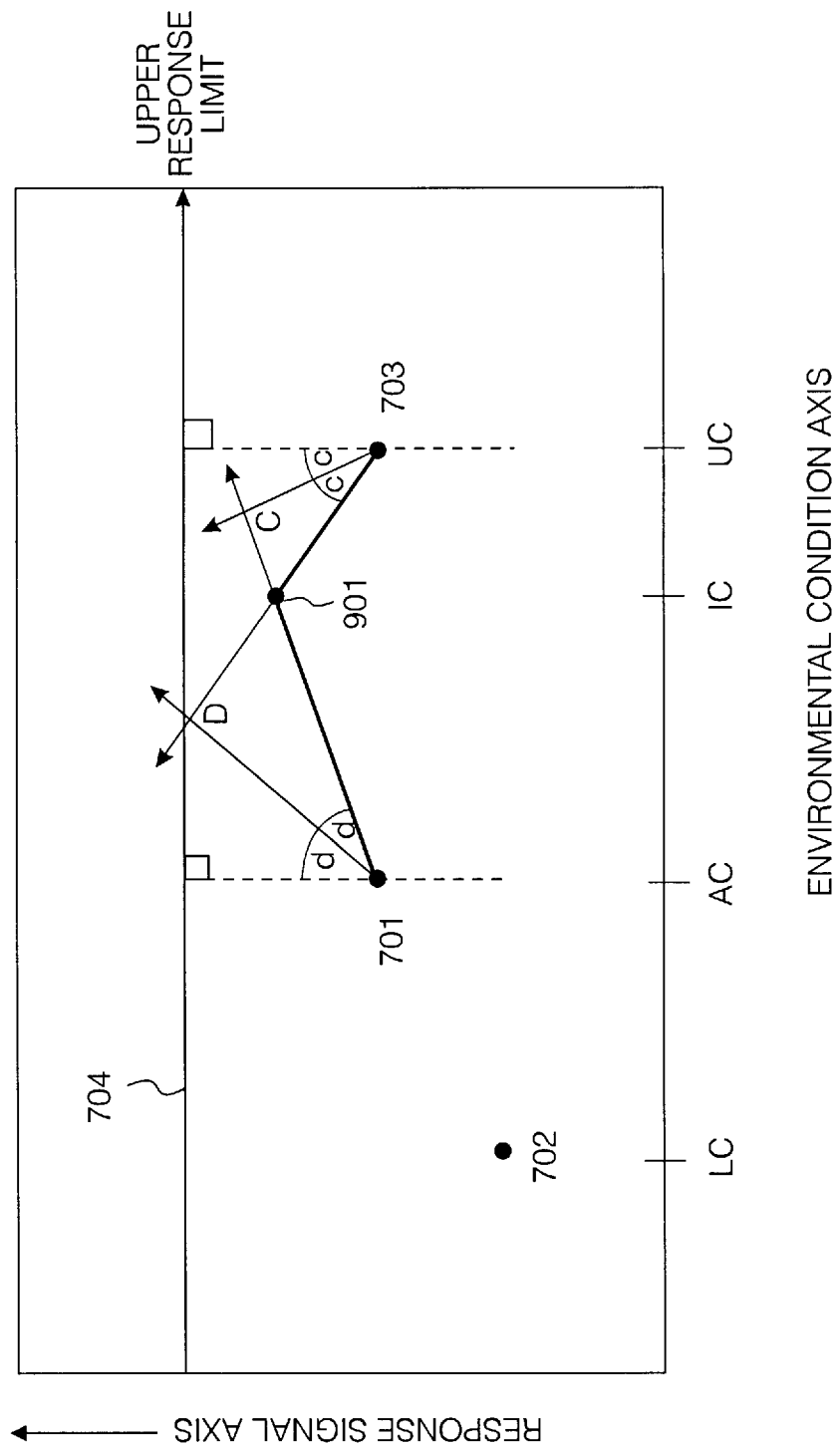
FIG. 10 illustrates a result of an automated analysis of the test result of FIG. 9.
Figure 11:
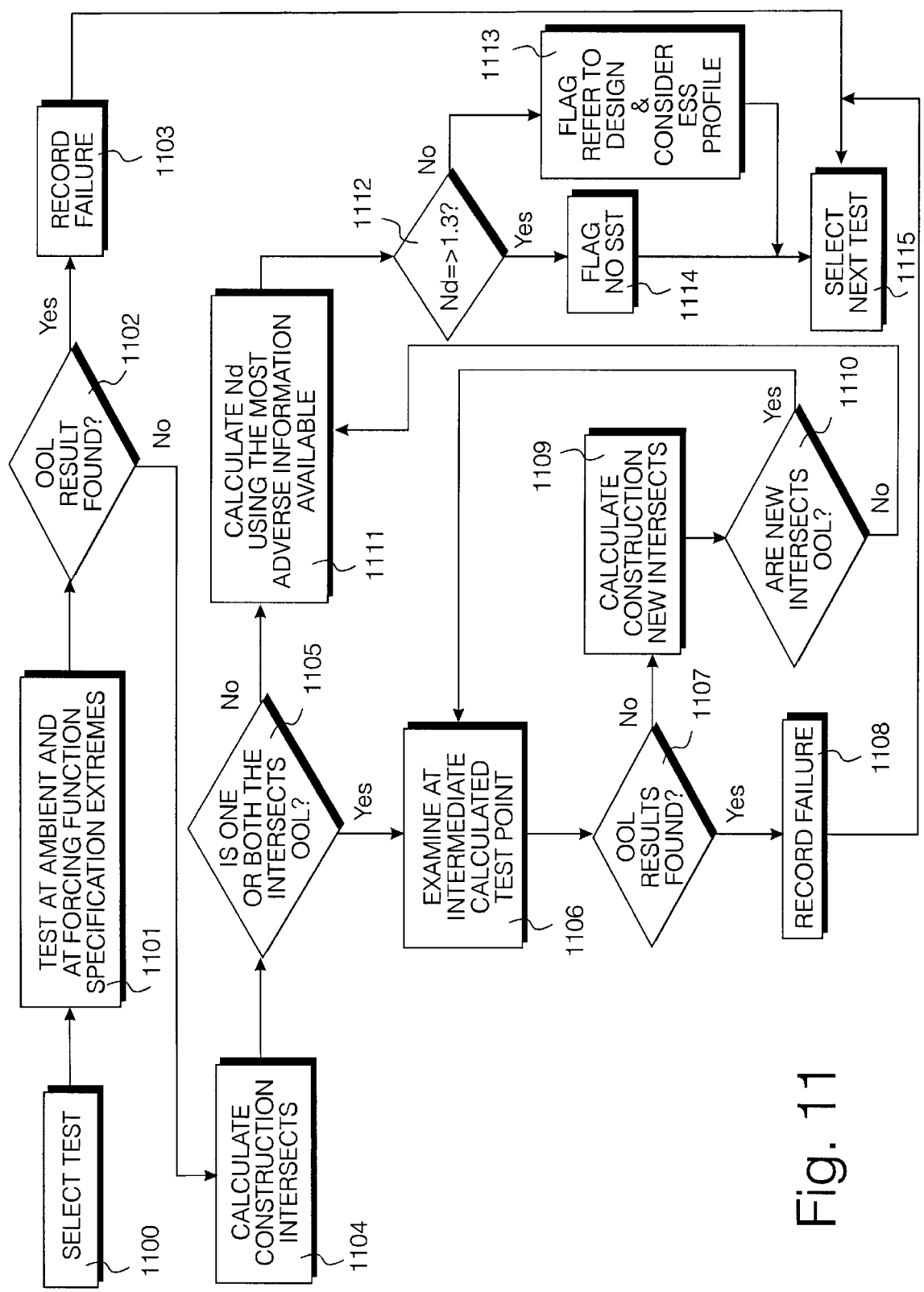
FIG. 11 illustrates a process for testing an equipment in respect of a single performance parameter.

Referring to FIG. 10 herein, there is shown an example of calculation of the new estimate maximum signal responses C, D determined from the intermediate environmental condition signal response 901, the ambient environmental condition signal response 701 and the upper environmental condition signal response 703. In this case, since neither of the new estimate maximum signal responses C or D are determined in step 1110 to be beyond the upper response limit 704, the processor proceeds to calculate a robustness index Nd in step 1112.

If it had been determined in step 1110 that either one of the new set of estimate maximum signal responses were beyond the upper response limit 704, then the analyser would calculate the environmental condition corresponding to the new estimated maximum signal responses, and generate a signal to the test controller 104 which would then instruct the chamber controller 108 and test equipment 103 to perform a test measurement at the new calculated environmental conditions, in order to obtain an actual signal response from the equipment under test at these environmental conditions, at step 1106. If the new signal responses were outside the upper response limit, then a failure would be recorded at step 1108 and the next test selected. However, if both new actual signal responses were within the response limit, at step 1109 the process of calculating a third set of estimated signal responses would commence, similarly as described herein above, for each of the new signal responses. This would result in calculation of a third set of estimated maximum signal responses comprising four estimated maximum signal responses, designated E, F, G and H herein. If any of the third set of estimated signal responses were beyond the upper response limit, then the process described in FIG. 12 herein would be repeated, setting the environmental chamber to the new environmental conditions corresponding to the third set of estimated signal responses in order to obtain actual signal responses under those conditions. However, if all of the third set of estimated maximum signal responses were within the upper response limit, then the processor would record the parameter as being within the limit 704, and proceed to step 1111 to calculate the robustness index Nd for the test parameter.

Thus, it can be seen that the analyser inspects the response signals received from the equipment under test, and searches within the environmental conditions specified for an environmental condition at which the peak signal response occurs by using actual signal responses obtained by the test equipment to calculate estimated signal responses and then testing whether the estimated signal responses are within the predefined parameter performance limits. The searching for the peak signal in respect of the performance parameter stops as soon as all measured signal responses and all currently estimated signal responses are within the specified performance limit.

FIGS. 7 to 11 illustrate estimation of signal responses in the case of a single specified performance limit. Where a double performance limit is specified, ie an upper and lower range of parameter performance, the closeness of the signal responses to the lower response limit is found similarly as described above. Where the processor 300 searches for a peak signal response nearest a lower specified limit of performance, the processor searches for the peak by estimating a set of minimum signal responses and checks whether these, and the actual signal responses of the equipment measured at environmental conditions corresponding to the estimated responses, are within the lower specified performance limit.

Figure 12:
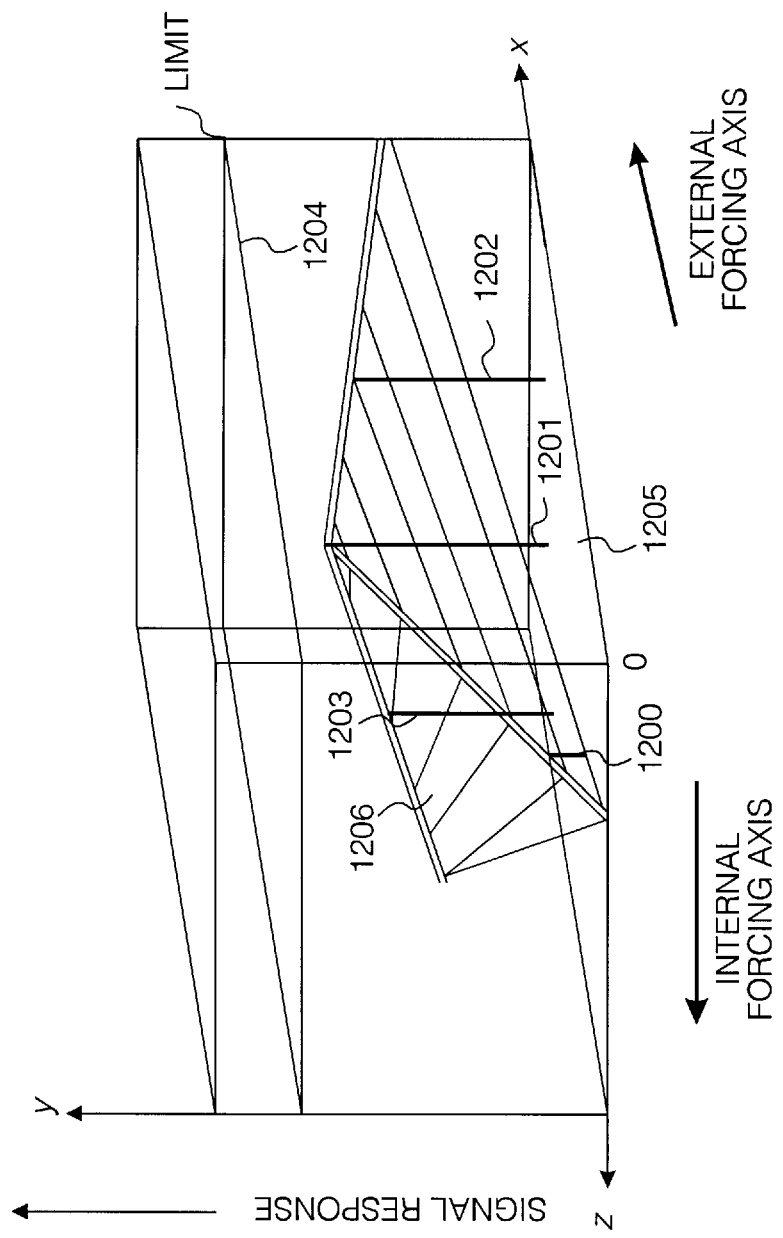
FIG. 12 illustrates a 3-Dimensional representation of test results of an item of equipment.

Referring to FIG. 12 herein, there is shown a 3-Dimensional representation of signal responses for a single performance parameter on the vertical axis, against variation in environmental condition along the X axis, the variation in environmental condition being an external forcing factor, and variation against the internal forcing factor ie the input test signal value on the Z axis.

There is shown a signal response 1200 at a lower specified environmental limit, a signal response 1201 at an ambient environmental condition, and a signal response 1202 at an upper specified environmental limit, as well as an intermediate signal response 1203 at an intermediate environmental condition.

An upper specified performance limit comprises a plane 1204. The height of the signal response in the vertical axis represents the value of the signal response output from the equipment under test, when subjected to a combination of internal forcing factor and external forcing factor, represented as a point in a forcing factor plane 1205. The peaks of the vertical signal responses lie on an upper 3-D surface 1206, comprising the upper performance limits of the equipment with respect to the selected parameter over the range of environmental conditions and input test signals. Upper and lower internal forcing factors represent the maximum and minimum test signals applied to the equipment, and the upper and lower values of the external forcing factor represent the upper and lower extremes of environmental condition applied to the equipment. The extent of the internal and external forcing factors creates an envelope of forcing factors over which the performance parameter of the equipment is tested. The difference between the maximum height and the minimum height of the 3-D surface corresponding to the peaks of signal responses over the entire envelope represents a maximum range of signal responses for the performance parameter.

Figure 13:
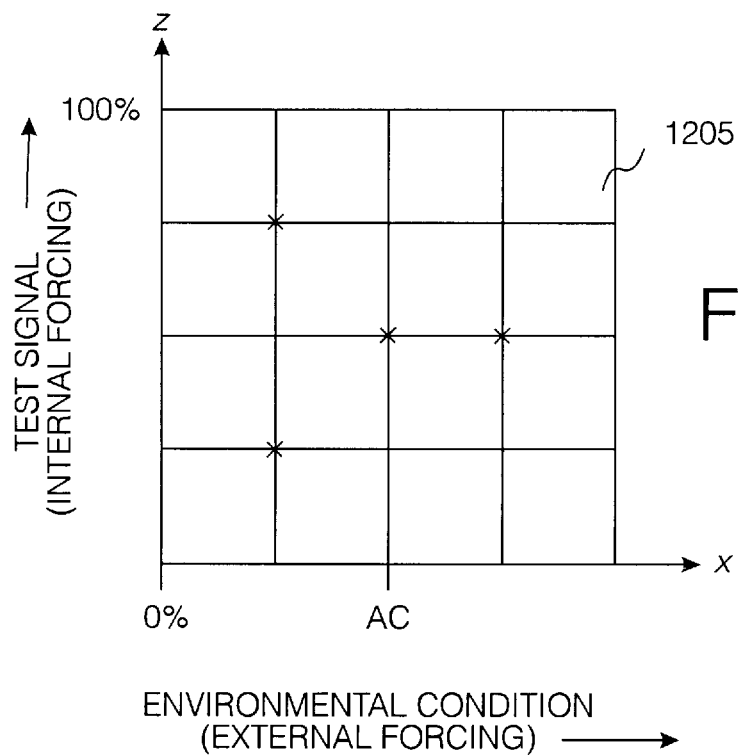
FIGS. 13 and 14 illustrate test patterns for selecting test points within a 2-Dimensional forcing function envelope.

Referring to FIG. 13 herein, there is shown an arrangement of test sites in the forcing factor plane 1205. The forcing factor plane 1205 has in the horizontal X axis the external forcing factor, ie the environmental condition, and in the horizontal Z axis the internal forcing factor, ie the test signal.

In FIG. 13 response signals can be obtained over a range of environmental conditions, and over a range of test signals. In the case of FIG. 13, four test sites are selected, one test is performed at the ambient environmental condition, one test is performed at the upper specified limit environmental condition, and two tests are performed at the lower specified limit environmental condition. The two tests at the lower specified environmental condition limit are performed at a lower test signal value and an upper test signal value respectively. The purpose of testing equipment using a median value of test signal, is that initially it may be unknown whether the signal response obtained will be greatest using a smallest test signal or a largest test signal. To economise on the number of tests, a median value test signal is selected.

Figure 14:
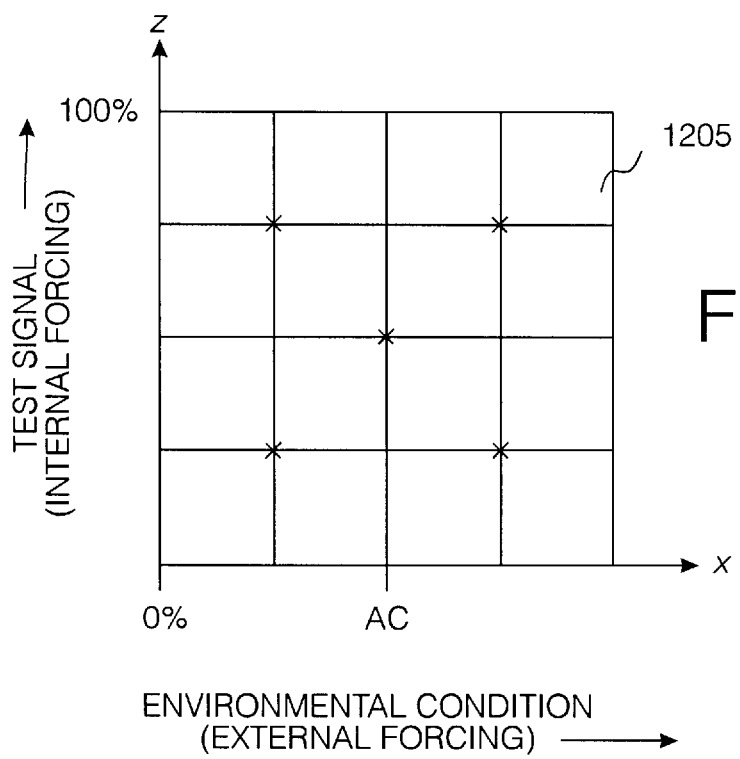

Referring to FIG. 14, where it is required to test over a wider range of internal forcing factors, further test sites can be selected. In the case of FIG. 14, there are shown five test sites, two at the lower environmental conditional limit, and two at the upper environmental conditional limit with a single test site at the ambient environmental condition.

Figure 15:
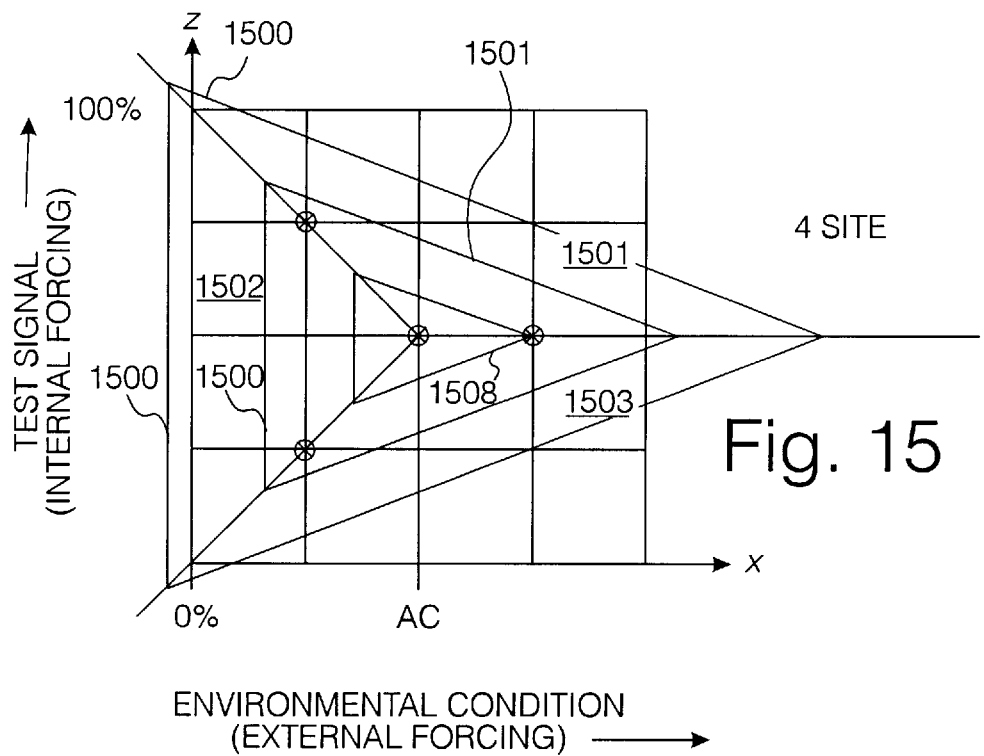
FIGS. 15 and 16 illustrate 3-Dimensional surfaces representing estimated signal responses resulting from test patterns as shown in FIGS. 13 and 14.

Referring to FIG. 15, in the case of four test sites, a 3-Dimensional surface can be calculated intersecting the peaks of the signal responses. The processor 300 calculates data corresponding to a 3-D model representing surface planes 1501, 1502 and 1503, represented by gradient lines 1500. The process referred to in FIGS. 7 to 11 herein, iteritively searches for a peak of the 3-D surface, and estimates whether this is below the specified performance limit plane 1204.

Figure 16:
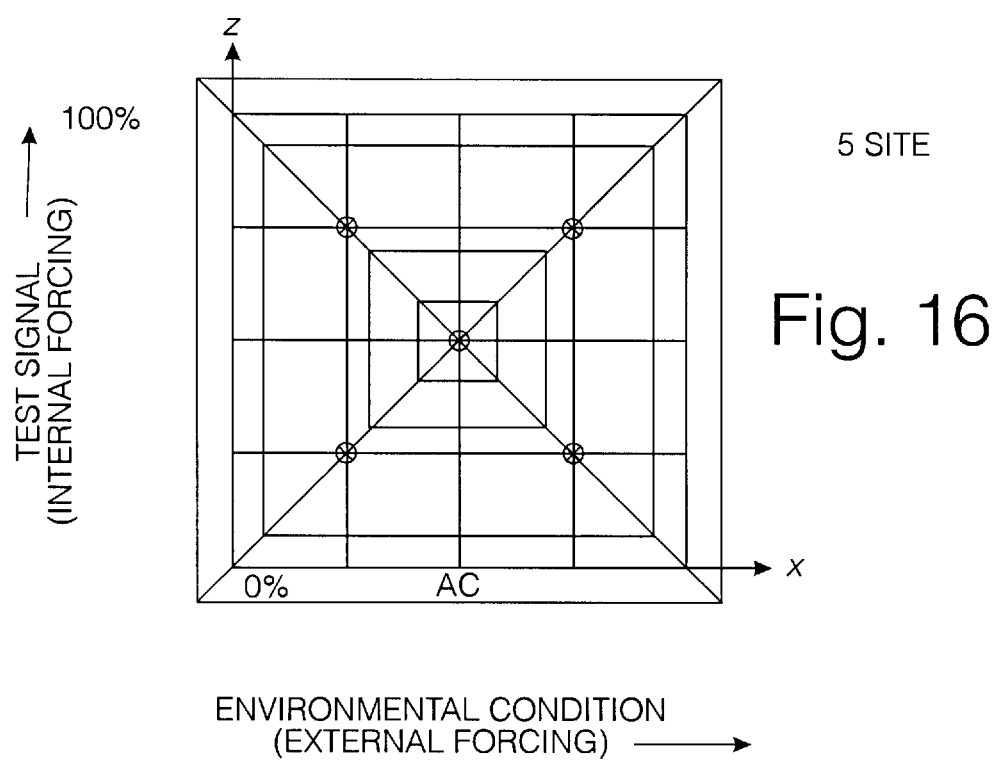

Referring to FIG. 16 herein, there is shown a 3-D surface corresponding to a test of signal responses in relation to a single performance parameter, tested at five test sites in the forcing factor plane 1205, resulting in five separate signal responses.

The patterns of test sites as shown in FIGS. 13–16 seek to optimize the test procedure by performing the minimum number of tests, to obtain the maximum amount of information on the performance parameter over the forcing factor envelope.

An object of following the above procedure is to quickly and efficiently identify a likely environmental condition under which a performance parameter will come closest to a specified performance parameter limit, with a minimum number of test cycles, thereby improving the speed of overall equipment testing.

Having established by the process described with reference to FIGS. 7 to 16 that the maximum or minimum signal response within the internal and external forcing factor envelope is within the specified upper and lower performance limits, the processor proceeds to implement a test for estimating the robustness of the equipment item under test.

Robustness of the equipment item under test is determined by calculating one or more robustness indices for each performance parameter tested as being within the specified performance limits, and by comparing the robustness indices for a particular performance parameter with a predetermined value, which can be selected.

The robustness indices are categorised as:
i. a design robustness index Nd, representing the inherent robustness of the equipment and is assessed keeping the equipment within the specified environmental conditions, and ii. an environmental robustness index Nr, representing the extreme limits of environment to which the equipment can be subjected before reaching the specified performance limits.

A value of Nd is obtained for each performance parameter, which is within the specified performance limits, and a value of Nr may be optionally obtained for selected performance parameters.

In general, if testing to obtain a value of environmental robustness Nr can be avoided, then this is preferred, since obtaining a value of Nr involves subjecting the equipment to environmental conditions outside those specified by the customer or international standard.

The design robustness index Nd takes into account both internal forcing factors applied to the equipment, ie the test signals applied by the testing equipment and the external forcing factors applied to the test equipment, ie the variation of environmental conditions to which the equipment is subjected.

The design robustness index Nd is calculated in step 1111 as follows:

The design robustness index Nd is the ratio of the spread of the actual signal responses measured compared to the spread of signal responses which could have occurred within the specified performance limits, taking account of the actual measured signal responses.

Thus, the design robustness index Nd is defined as the maximum allowable signal response divided by the maximum observed signal response over a predetermined range of environmental conditions within the specified limits of environmental conditions. The modulus of the design robustness index is always taken, in order to give a positive value for Nd.

Figure 17:
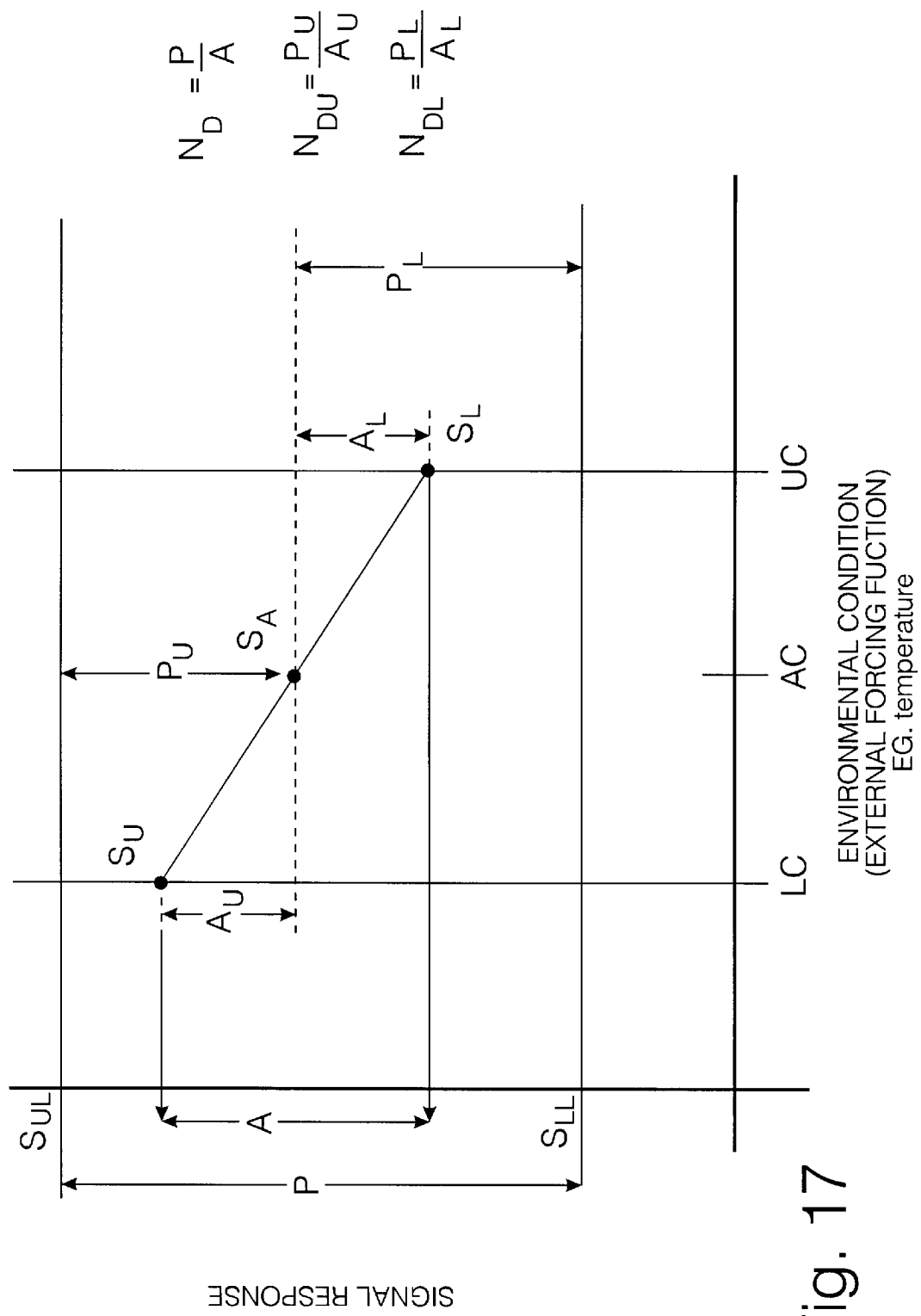
FIGS. 17 and 18 illustrate methods of determining a design robustness index for an item of equipment.
Figure 18:
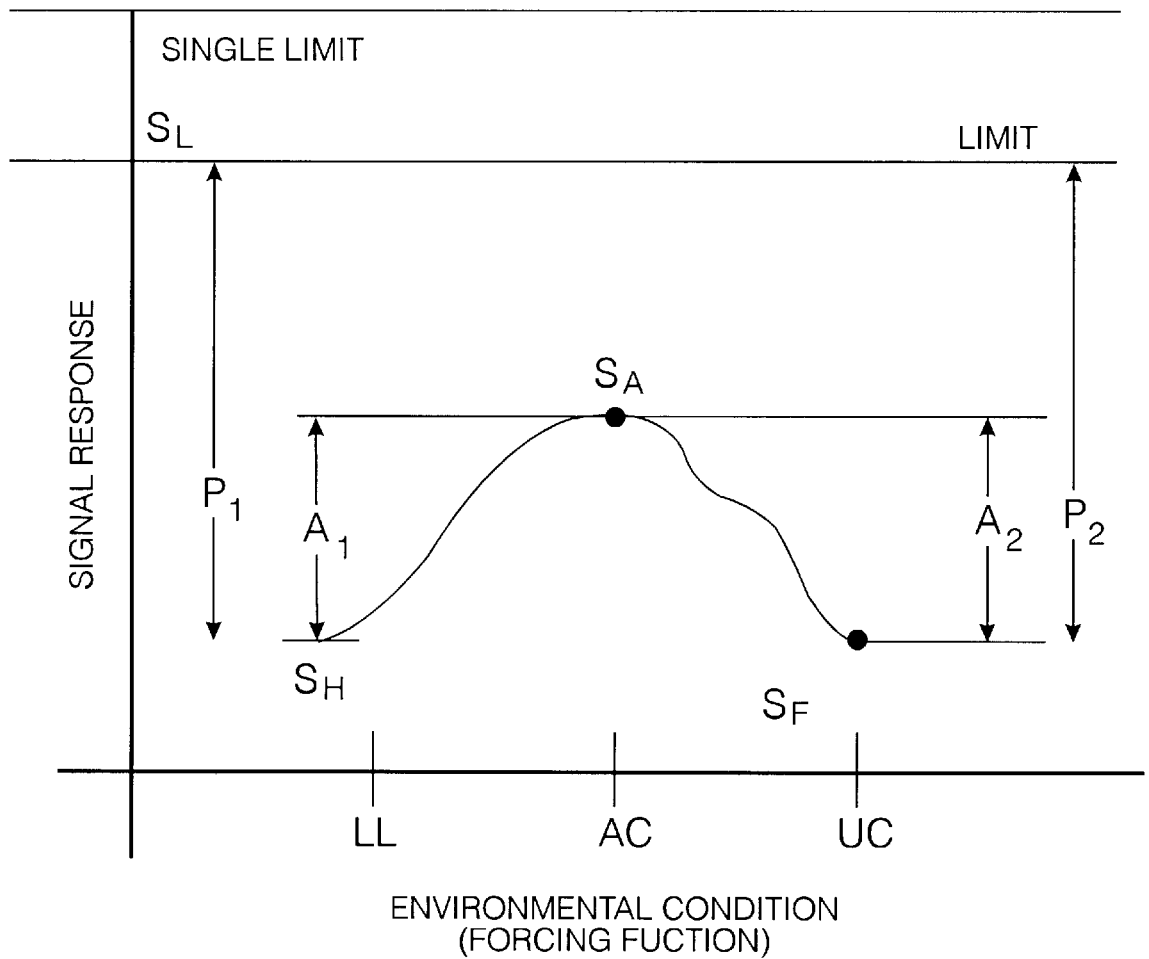

For a parameter for which there is a specified double response limit, ie an upper response limit and a lower response limit, the design robustness index Nd is calculated in step 1111 as:

$$Nd = P/A \qquad (1)$$

$$Nd_U = \frac{P_U}{A_U} = \frac{S_{UL} - S_A}{S_U - S_A} \qquad (2)$$

$$Nd_L = \frac{P_L}{A_L} = \frac{S_A - S_{LL}}{S_A - S_L} \qquad (3)$$

where
P=the maximum allowed response signal variation
A=the observed signal response variation within the specified environmental conditions
$S_{UL}$=The specified upper signal response limit
$S_{LL}$=The specified lower signal response limit
$S_A$=The signal response at ambient environment
$S_U$=The upper signal response at one specified environment limit
$S_L$=The lower signal response at the other specified environment limit Examples of calculation of an overall design robustness index Nd for one performance parameter represented by a signal response, and an upper and lower robustness indices $Nd_U$ and $Nd_L$ are shown in FIG. 17 herein. In FIG. 17, the robustness at higher temperature (UC) is greater than the robustness at lower temperature (UC), $Nd_L > Nd_U$.

For a parameter for which there is specified a single signal response limit, the ratio Nd is calculated as:

$$Nd = \frac{P_1}{A_2} = \frac{S_L - S_N}{S_A - S_F}$$

$$Nd1 = \frac{P_1}{A_1} = \frac{S_L - S_N}{S_A - S_N}$$

$$Nd2 = \frac{P_2}{A_2} = \frac{S_L - S_F}{S_A - S_F}$$

where
$S_L$=the specified signal response limit
$S_N$=the signal response at the environment limit nearest the signal response limit
$S_F$=the signal response at the other environment limit, furthest from the signal response limit If a value of Nd for the performance parameter monitored is found to be less than a predetermined value, in the case of the preferred method the value Nd of 1.3 is preferred, then it is assumed that production equipment items similar to the equipment item under test will not encounter problems in use. If a value of Nd of less than 1.3 is calculated, then the equipment passes the design robustness test. If a value Nd of 1.0 or less is obtained then the equipment is assessed as failing the design robustness test.

Data is output in step 406, identifying individual performance parameters and their corresponding design robustness indices Nd for all tested parameters. Any design robustness parameters in the range 1.0 to 1.3 are flagged ie identified, in step 1113 as being of unsatisfactory robustness and are of interest. Design robustness parameters above 1.3 are flagged in step 1114 as being unnecessary for testing by environmental stress screening.

If the equipment has not passed the design robustness test, and has a value of Nd<1.3, there is the option of environmentally stress screening the production equipment items prior to releasing them to the market, or further testing of the equipment item can be undertaken to see the maximum extreme environment which the equipment will tolerate before the performance limits are reached, ie by flexing the environmental envelope outside the limits specified by the customer specification. If it is decided to flex the environmental envelope then these tests are performed only after the test runs for the design robustness have been undertaken. A user of the apparatus may input instructions using the user interface, to prevent or authorise automated testing of the equipment at extreme environmental conditions outside those specified by the customer.

Figure 19:
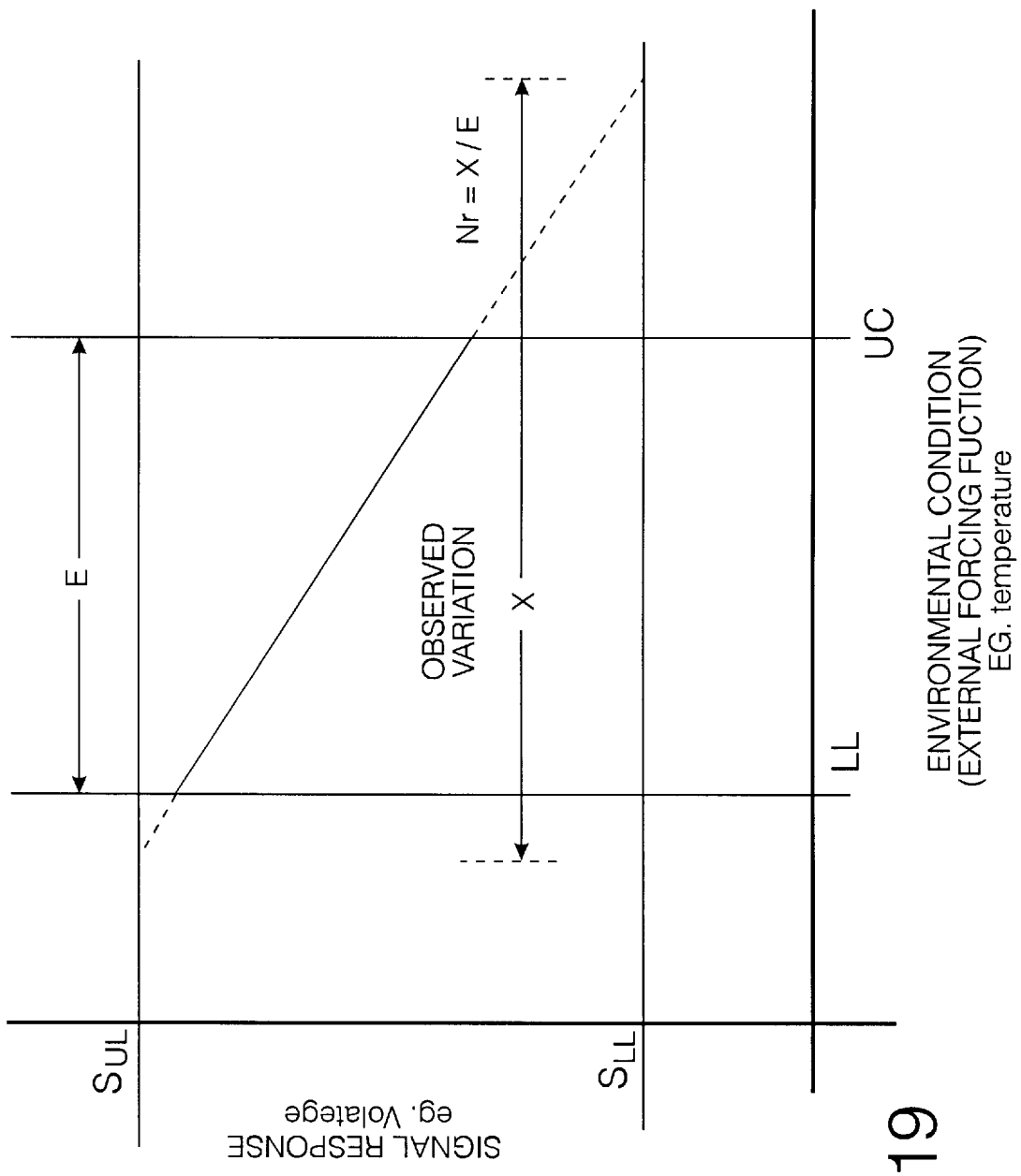
FIG. 19 illustrates a method of determining an environmental robustness index for an item of equipment.

Referring to FIG. 19 herein the environmental robustness index Nr is expressed as the ratio of the observed environmental operating range X for which the performance remains within specified limits to the specified environmental operating range E.

$$Nr=X/E$$

Where the equipment has failed the environmental robustness test (ie Nr<1.3) for a particular performance parameter, performance of the equipment with respect to that parameter is further investigated by the design engineers and design team of the equivalent item. For example, where there is an equipment item which has failed the environmental robustness test with respect to a particular performance parameter, it may be that by redesign of the equipment, the performance characteristic can be amended to one which passes the environmental robustness test and has a value of Nr less than 1.3.

Alternatively, it may be that although the performance characteristic is close to the upper response limit, the characteristic is stable as between different equipment items, and an insignificant variation of the characteristic could be expected in a production run, in which case although the equipment fails the robustness test as defined by the parameter Nd, in practice, production items are likely to be reliable with respect to the performance parameter of interest, in which case a decision may be taken to proceed with production of the equipment anyway.

If the environmental robustness index Nr is greater than 1.3, then although the design robustness index Nd may be less than 1.3 the equipment is passed for production.

The above process is repeated for each parameter in the set of customer specified performance parameters. Thus, for a complex piece of equipment under test, there may be of the order of one hundred or more such test cycles, each relating to a particular performance parameter to be tested.

Referring again to FIG. 5 herein, having obtained a full output test data 501, comprising values for Nd, Nr, and the results of testing for the peak signal within the environmental condition limits for each parameter, there may be taken an overall decision on whether to release the equipment directly to market, or to stress screen each equipment item before leaving the factory using a custom built factory chamber as shown in FIG. 6.

Where it is decided to stress screen each equipment item prior to leaving the factory, the factory test chamber as shown in FIG. 6, is designed utilizing the output test data 501, in order to minimize the number of tests which the equipment undergoes, testing only those performance parameters for which values of Nd and Nr are unsatisfactory.

I claim:

1. A method of assessing a robustness of an item of equipment, said method comprising the steps of:

setting a range of operating environments for the equipment;

setting a performance specification limit data describing limits of an operating performance specification of said equipment item within said range of operating environments;

obtaining data corresponding to actual performances of the equipment within said performance specification and within said range of operating environments;

comparing said actual performance data obtained within said performance specification with said performance limit data; and depending on the result of comparing said actual performance data with said performance limit data, implementing a decision either rejecting said equipment as having unsatisfactory robustness, or accepting said equipment as having adequate robustness said decision based on said comparison.

2. The method as claimed in claim 1, wherein said step of comparing said actual performance data with said performance limit data comprises generating a design robustness index data of said performance limit data divided by said actual performance data.

3. The method as claimed in claim 1, wherein, said range of operating environments is set outside a specified range of operating environments; and data corresponding to actual performance of said equipment at said operating environments is obtained outside said specified range of operating environments.

4. The method as claimed in claim 1, further comprising obtaining performance data at said limit of performance.

5. The method as claimed in claim 1, comprising the step of generating an environmental robustness index data of a maximum operating environment range of said equipment for which said performance data lies within said performance limit data, divided by a specified operating environment range of said equipment.

6. A method of assessing a robustness of an item of equipment, said method comprising the steps of:

defining a limit of performance of said equipment item according to an operating specification of performance;

defining an environmental operating range of said equipment item according to an equipment specification;

obtaining a performance data of said equipment at limits of said environmental operating range said obtained performance data being obtained within said performance limit;

obtaining performance data of said equipment at an ambient operating environment between said limits of said environmental operating range said obtained performance data within said performance limit;

comparing a difference between said obtained performance data at said ambient operating environment and said limit of performance with a difference between a said obtained performance data at a limit of said environmental operating range and said performance data at said ambient operating environment; and implementing a decision either rejecting or accepting said equipment depending on a result of said comparison.

7. A test apparatus for assessing a robustness of an item of equipment, said test apparatus comprising:

means for setting a range of operating environments for the equipment;

means for setting a performance limit data describing a limit of performance for the equipment within said range of operating environments;

means for obtaining data corresponding to actual performances of the equipment within said performance limit and within said range of operating environments;

means for comparing said actual performance data obtained within said performance limit with said performance limit data, and depending on the result of said comparison, producing data describing said equipment as having unsatisfactory robustness, or producing data describing said equipment as having adequate robustness.

8. A method of assessing a robustness of an item of equipment, said method comprising the steps of:

setting a data concerning a range of specified operating environments for the equipment;

setting a performance limit data describing a limit of performance for the equipment according to a performance specification of said equipment;

obtaining data corresponding to actual performances of the equipment within said range of specified operating environments;

obtaining performance data corresponding to said limits of performance, said data obtained at an actual operating environment;

comparing data concerning said actual operating environment with data concerning said specified operating environmental;

depending on the result of comparing said actual operating environment data with said specified operating environment data, implementing a decision for either rejecting said equipment as having unsatisfactory robustness, or accepting said equipment as having adequate robustness.

9. The method as claimed in claim 8, wherein said step of comparing data concerning said actual operating environment with data concerning said specified operating environment comprises dividing data describing a range of said actual operating environment by data describing a range of said specified operating environment.

* * * * *